(12) United States Patent
Orme-Marmerelis et al.

(10) Patent No.: US 6,491,737 B2
(45) Date of Patent: Dec. 10, 2002

(54) HIGH-SPEED FABRICATION OF HIGHLY UNIFORM ULTRA-SMALL METALLIC MICROSPHERES

(75) Inventors: Melissa Orme-Marmerelis, Irvine, CA (US); Robert F. Smith, Costa Mesa, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/860,803

(22) Filed: May 18, 2001

(65) Prior Publication Data
US 2002/0031677 A1 Mar. 14, 2002

Related U.S. Application Data
(60) Provisional application No. 60/206,507, filed on May 22, 2000.

(51) Int. Cl.[7] .................................................. B22F 9/00
(52) U.S. Cl. ........................................ 75/335; 75/340
(58) Field of Search .................................. 75/335, 340

(56) References Cited

U.S. PATENT DOCUMENTS

| | | | |
|---|---|---|---|
| 4,068,241 A | 1/1978 | Yamada | 346/75 |
| 4,288,797 A | 9/1981 | Horike et al. | 346/75 |
| 4,734,705 A | 3/1988 | Rezanka et al. | 346/1.1 |
| 5,171,360 A | 12/1992 | Orme et al. | 75/331 |
| 5,226,948 A | 7/1993 | Orme et al. | 75/331 |
| 5,259,593 A | 11/1993 | Orme et al. | 266/78 |
| 5,266,098 A | 11/1993 | Chun et al. | 75/335 |
| 5,340,090 A | 8/1994 | Orme et al. | 266/202 |
| 5,407,458 A | 4/1995 | König et al. | 75/255 |
| 5,432,541 A | 7/1995 | Pickell et al. | 347/74 |
| 5,445,666 A | 8/1995 | Peschka et al. | 75/335 |
| 5,520,715 A | 5/1996 | Oeftering | 75/335 |
| 5,722,479 A | 3/1998 | Oeftering | 164/46 |
| 5,746,844 A | 5/1998 | Sterett et al. | 148/522 |
| 5,810,988 A | 9/1998 | Smith, Jr. et al. | 204/666 |
| 5,861,323 A | 1/1999 | Hayes | 438/111 |
| 5,891,212 A | 4/1999 | Tang et al. | 75/335 |
| 5,894,980 A | 4/1999 | Orme-Marmarelis et al. | 228/33 |
| 5,894,985 A | 4/1999 | Orme-Marmarelis et al. | 228/262 |
| 5,938,102 A | 8/1999 | Muntz et al. | 228/102 |
| 5,960,853 A | 10/1999 | Sterett et al. | 164/271 |
| 6,007,183 A | 12/1999 | Horine | 347/46 |
| 6,027,699 A | 2/2000 | Holcomb et al. | 422/186.04 |
| 6,082,605 A | 7/2000 | Farnworth | 228/33 |
| 6,186,192 B1 | 2/2001 | Orme-Marmarelis et al. | 141/18 |
| 6,224,180 B1 | 5/2001 | Pham-Van-Diep et al. | 347/2 |

*Primary Examiner*—Ngoclan Mai

(57) ABSTRACT

In a high-speed fabrication process for producing highly uniform ultra-small metallic micro-spheres, a molten metal is passed through a small orifice, producing a stream of molten metal therefrom. A series of molten metal droplets forms from the break up of the capillary stream. Applied harmonic disturbances are used to control and generate satellite and parent droplets. Significantly, the satellite droplets formed are smaller than the orifice, allowing for the production of smaller metal balls with larger orifices. The satellite droplets are separated from the parent droplets by electrostatic charging and deflection or by aerodynamic or acoustic sorting. Preferably, the satellite droplets are cooled before being collected to avoid defects and achieve high uniformity of the resulting metal balls.

15 Claims, 4 Drawing Sheets

HIGH-SPEED FABRICATION OF HIGHLY UNIFORM ULTRA-SMALL METALLIC MICROSPHERES

This application is related to U.S. applications Ser. Nos. 09/860,798 and 09/860,802, filed May 18, 2001, the contents of which are hereby fully incorporated by reference. This application is related to provisional U.S. application Ser. No. 60/206,507, filed May 22, 2000, the contents of which are hereby fully incorporated by reference.

This invention was made with Government support under Grant No. DMI-9457205, awarded by NSF. The Government has certain rights in this invention.

FIELD OF THE INVENTION

The invention relates to methods of fabricating highly uniform, ultra-small metallic micro-spheres or balls, and to the balls themselves, from capillary stream break-up at high rates.

BACKGROUND OF THE INVENTION

The generation of droplets from capillary stream break-up has been studied at least as early as Lord Rayleigh in the 1800s. More recently, the formation of metallic micro-spheres, or balls, from the break-up of a molten metal capillary stream has been studied. Such balls are commonly used in the electronics industry for various applications, including interconnects for small electronics packages and in the manufacture of conductive pastes. Using the process of capillary stream break-up, the balls can be produced at very high rates—typically tens of thousands of droplets per second. Further, the nature of droplet formation due to capillary stream break-up results in highly uniform balls. The highly uniform size of the metal balls formed from capillary stream break-up is a significant improvement over other methods of forming conductive powders—such as spray atomization or melt spinning—which require the extra step of sieving or sorting the differently sized balls. This extra step is labor intensive, significantly increasing the time and cost of the manufacturing process; however, with such technologies, sorting or sieving is necessary to achieve tight ball diameter tolerances (on the order of five percent).

In the production of metal balls from capillary stream break-up, it is advantageous to effectively cool the balls so that they solidify before landing or bonding with each other. Effective solidification reduces or eliminates (1) irregularly shaped balls that have dented when they impinge and (2) irregularly sized balls that have bonded together because they were insufficiently cooled. Without effective solidification, removal of these defects requires that the balls be sieved or sorted.

Conventional methods of formation of metal balls due to capillary stream break-up tend to be limited to metal balls having diameters in excess of 50 microns. A significant limitation on the size of metal balls produced from capillary stream break-up is the size of the orifice from which the capillary stream emerges. Typically, droplets generated from capillary stream break-up have diameters that are roughly twice as large as the diameter of the capillary stream orifice. The production of smaller balls, therefore, typically requires smaller orifices. As the orifice becomes very small, it tends to be more easily clogged by, e.g., impurities in the molten metal. Further, obtaining smaller orifices that are also uniform tends to be difficult and expensive. Current state-of-the-art provides a lower limit of orifice diameter available off-the-shelf and suitable for use with molten metals of 25 microns.

SUMMARY OF THE INVENTION

Accordingly, the present invention enables the formation of metallic micro-spheres due to capillary stream break-up that are significantly smaller than metallic micro-spheres formed by conventional methods and, more particularly, to metallic micro-spheres that are significantly smaller than the capillary stream orifice from which they emerge, thereby overcoming many of the difficulties that plagued the prior art by advantageously enabling the formation of much smaller micro-spheres from larger orifices. The present invention further enables forming highly uniform metalic micro-spheres or balls, having diameters on the order of about 1 to 100 microns, and preferably less than 25 microns, without the defects and difficulties associated with conventional methods.

A method of manufacturing ultra-small metallic spheres comprises directing a capillary stream of molten metal from an orifice by applying an excitation disturbance, wherein the excitation disturbance is determined so that parent droplets and satellite droplets form from the stream due to capillary stream break-up. In one innovative aspect of the present invention, the satellite droplets are separated from the parent droplets; cooled to form solid balls of substantially spherical shape; and collected as separate solid satellite balls. In another innovative aspect of the present invention, the satellite and parent drops are simultaneously cooled and collected as solid balls.

In one embodiment, the separating step is accomplished by electrostatically charging the droplets and directing them through an electric field, whereby the satellite and parent droplets deflect differently due to the different charge-to-mass ratios. In another embodiment, the droplets may be directed through a second electric field, a rotating field, or both to further disperse the droplets. In either of these embodiments, the electrostatic charge may vary over time while the electric field remains constant or the electric field may vary over time while the electrostatic charge remains constant.

In accordance with another embodiment, separation of the satellite and parent droplets is accomplished by acoustic forcing. In accordance with yet another embodiment, the satellite and parent droplets are separated with aerodynamic forces.

In another innovative aspect, a solid metal ball of the present invention has a diameter that is preferably substantially less than the diameter of the capillary orifice. In a further innovative aspect, a solid metal ball of the present invention is substantially spherical and has a diameter in a range of about 1.0 to 100 microns, and preferably less than 25 microns. In yet a further innovative aspect, a metallic powder comprises a plurality of such balls, wherein the balls are highly uniform having a ball diameter tolerance of a mean ball diameter in the range of about 0.5 to 3.0 percent, and preferably less than 2.0 percent, without performing a mechanical sieving or sorting step.

In another innovative aspect of the present invention, the metal balls, satellite or both satellite and parent, are produced at a rapid rate, wherein the balls are highly uniform, having highly uniform diameters. More particularly, the balls may be produced at a rate preferably in a range of about 1000 to 200,000 balls per second, and preferably at a rate greater than about 4000 balls per second while maintaining a ball diameter tolerance in the range of about 0.5 to 3.0 percent, and preferably a ball diameter tolerance of less than about 2.0 percent, without performing a mechanical sieving or sorting step.

Other aspects and features of the present invention will become apparent from consideration of the following description taken in conjunction with the accompanying drawings.

DETAILED DESCRIPTION OF THE PREFERRED EMBODIMENTS

In accordance with the present invention, ultra small metal balls or micro-spheres are produced at a high rate by capillary stream break-up, wherein highly uniform and predictable droplets break from a capillary stream of molten metal. The present invention enables the formation of metallic micro-spheres due to capillary stream break-up that are significantly smaller than metallic micro-spheres formed by conventional methods and, more particularly, to metallic micro-spheres that are significantly smaller than the capillary stream orifice from which they emerge, thereby overcoming many of the difficulties that plagued the prior art by advantageously enabling the formation of much smaller micro-spheres from larger orifices. The balls may be formed from one or a combination of various metals, including solder, copper, nickel, titanium, or any metal having physical properties (e.g., melting point) suitable for the process described herein.

Figure 1:
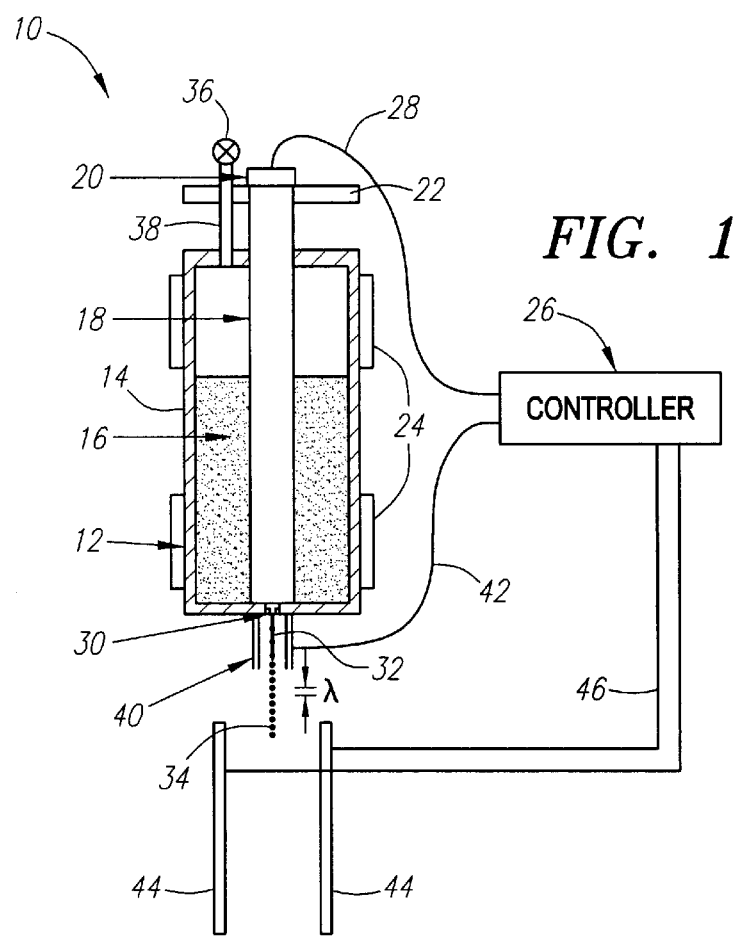
FIG. 1 is a cross sectional view of the droplet generation system.

FIG. 1 shows a system 10 for producing metal balls in accordance with one embodiment. To form a capillary stream, a droplet generator 12 is provided. One example of a droplet generator suitable for these purposes is described in U.S. Pat. 6,186,192 to Orme et al., hereby incorporated in full by reference. This patent describes a system for generating a capillary stream of molten metal, from which a continuous series of molten droplets form. Although the patent is directed to producing droplets of molten solder, any metal having a suitable melting point may be used therewith.

The droplet generator 12 includes a chamber 14 adapted to hold a reservoir of molten metal 16 therein. As explained, this molten metal comprises any metal having physical characteristics compatible with the system 10 and method described. The melting point of some metals, for example, may be too high to use with the system 10 shown in FIG. 1. A vibrating rod 18 is slidably disposed within the chamber 14, contacting the molten metal 16. The rod 18 is mechanically coupled to a piezoelectric crystal or transducer 20 and, as described, is used to impart a disturbance in the molten metal. However, it should be appreciated that a disturbance may be imparted mechanically with a piezoelectric transducer with or without a rod or plunger—for example, the piezoelectric transducer may be placed under the orifice to eliminate the rod or plunger—or a disturbance may be imparted from magnetic, electric or acoustic forces.

As shown, the piezoelectric crystal 20 is disposed outside the chamber 14 to protect it from the heat of the molten metal 16, as piezoelectric materials can be damaged if subjected to high temperatures. However, for metals with low melting points, such as solder, it may be possible to immerse the piezoelectric crystal in the molten fluid or position the piezoelectric crystal under the orifice where temperatures are high. To further protect the piezoelectric crystal 20 from heat transferred from the vibrating rod 18, a cooling jacket 22 may be attached to the vibrating rod 18, or to a housing around the rod 18, near the crystal 20 to keep it at a cooler temperature. The cooling jacket 22 may be, for example, fluidly coupled to a circulating water supply that circulates room temperature water through the cooling jacket 22. Additionally, to maintain the molten metal 16 inside the chamber 14 above its melting point, heaters 24 may be coupled to the outer wall of the chamber 14 at spaced-apart locations.

A controller 26, which may comprise one or more microprocessors and one or more power supplies, is electrically coupled to the piezoelectric crystal 20 by electrical connection 28. The controller 26 delivers an alternating electrical signal to the piezoelectric crystal 20, causing a corresponding mechanic response. The vibrating piezoelectric crystal 20 causes the vibrating rod 18, to which the crystal 20 is coupled, to oscillate. The vibrating rod 18 is preferably biased with a periodic waveform, typically with a magnitude of about 50 to 300 Volts, and a fundamental frequency f which corresponds to the frequency of perturbation applied to the capillary stream for uniform droplet production, determined by the following equation:

$$f = \frac{k \cdot V}{2\pi r_o}, \tag{1.0}$$

wherein V is the droplet or stream velocity, $r_o$, is the orifice radius, and k is a non-dimensional wavenumber constant, which depends on the fluid properties of viscosity, surface tension and density, and ambient gas density. See M. Orme, "On the Genesis of Droplet Stream Microspeed Dispersions," *Physics of Fluids*, 3, (12) pp 2936–2947, 1991. The constant k tends to vary between 0.4 and 0.8; for inviscid fluids, k equals 0.697. It should be appreciated that uniform droplets may be produced at high rates and that the fundamental frequency f varies according to orifice size and stream velocity. Preferably, the fundamental frequency f, and thus the droplet production rate, is in a range of about 1000 Hz to 200 kHz.

The molten metal 16 is ejected from the chamber 14 through an orifice 30 in the bottom of the chamber 14, from which a stream 32 of the molten metal forms. The oscillation of the vibrating rod 18 produces a standing wave in the molten metal 16 and in the stream 32 as it leaves the orifice 32. Due to capillary stream break-up, molten metal droplets 34 form by detaching from the stream 32. A droplet 34 formed from capillary stream break-up has a diameter typically about twice the diameter of the orifice 30. With the current state-of-the-art of off-the-shelf orifices having diameters limited to 25 microns or greater, the droplets formed from streams emerging from such orifices tend to be in excess of 50 microns. To control the formation of molten metal droplets 34 leaving the droplet generator 12, a supply 36 delivers nitrogen gas (or other inert gas, such as argon) along a gas line 38 to pressurize the chamber 14, thereby affecting the tendency of molten metal 16 to leave the chamber 14 through the orifice 30. Nitrogen (or other inert gas, such as argon) may also be supplied through a gas line to a detachable end assembly to further control solder droplets. Preferably, the inert gas is a high purity gas, such as research grade or better.

Figure 2:
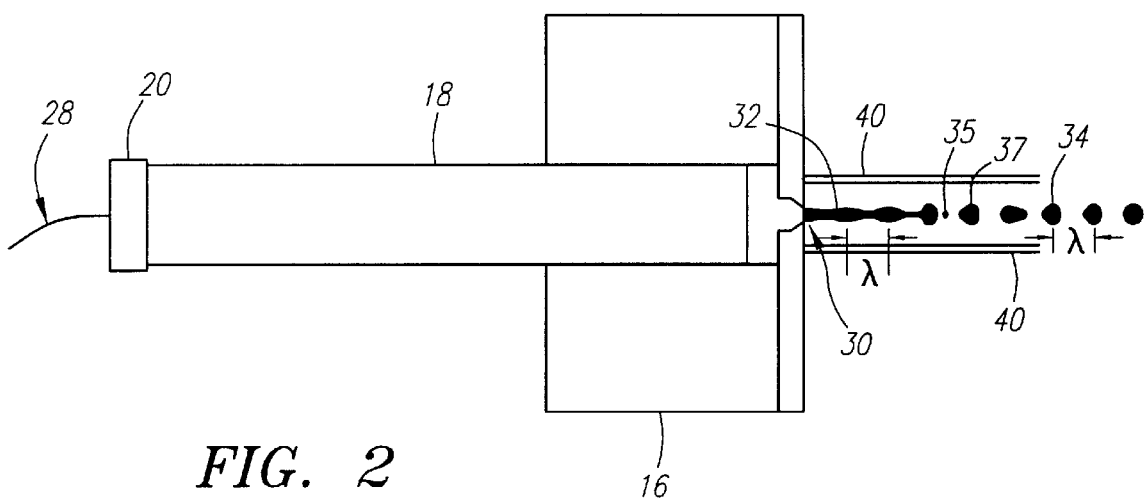
FIG. 2 is a side view of the capillary stream and satellite droplet formation.

FIG. 2 illustrates the process of generating droplets from capillary stream break-up. An axisymmetric excitation disturbance is imparted to the stream 32 whose fundamental wavelength is in the region of Rayleigh growth. As described above, the disturbance is imparted, in this embodiment, by driving the piezoelectric crystal 20, to which the vibrating rod 18 is mechanically coupled, with an electrical signal representing the disturbance via line 28. Alternatively, as described above, the disturbance may be imparted with a piezoelectric transducer with or without a rod or plunger, or from magnetic, electric or acoustic forces. As illustrated, the disturbance grows, resulting in the standing wave on the stream 32 and causing the series of droplets 37,35 shown. The larger parent droplets 37 are typically on the order of twice the diameter of the orifice 30, whereas the smaller satellite droplets 35 have diameters much smaller than the orifice 30.

Depending on the characteristics of the excitation disturbance, a satellite droplet 35 will merge with the forward or rearward parent droplet 37 to form a merged droplet 34, or can be forced to maintain its position between the forward and rearward parent droplets 37 using an appropriate application of harmonics on the axisymmetric disturbance. An example of such a disturbance is one having second and third order harmonics, although many other disturbances are possible. In the example of FIG. 2, the satellite droplets merge with a parent droplet within one wavelength, λ, of the excitation disturbance. The merging time and the diameter of the satellite droplets can be manipulated by the waveform conditions. For example, waveforms composed of added harmonics, or waveforms with very high driving amplitudes, which effectively distort the linearity of the disturbance will affect the properties of the stellite droplets. Accordingly, the present invention uses harmonic disturbances to prevent instantaneous merging so that the satellite droplets can be deflected out of the main stream to separate the satellite droplets from the parent droplets. The diameter of the satellite droplet tends to be a function of the characteristics of the excitation disturbance, while the diameter of the parent droplet tends to be a function of the excitation disturbance and the nozzle orifice as shown by the following:

$$r_d = [r_o^3(8\pi)/(3\kappa_o) - r_s^3]^{1/3} \quad (2.0)$$

where $r_o$, is the orifice radius and $r_s$, is the satellite droplet radius.

Figure 3:
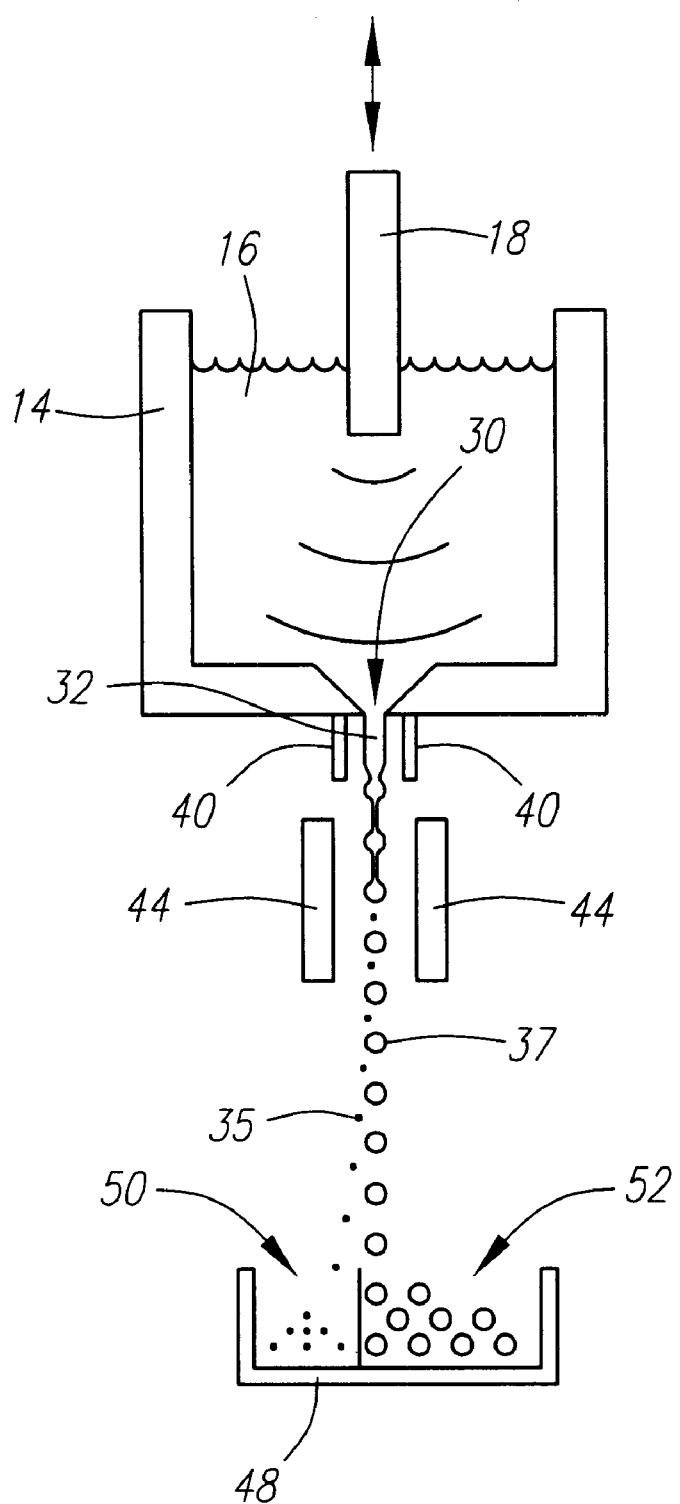
FIG. 3 is a schematic view of an embodiment for generating satellite droplets.

Once the satellite droplets 35 and parent droplets 37 are formed, they are separated, and then the satellite droplets 35 or satellite and parent droplets 35,37 are cooled, to solidify, and collected. FIG. 3 illustrates one method of separating the satellite droplets from the parent droplets using electrostatic forces. A charge electrode 40 is located near the orifice 30 where droplets 37,35 break from the capillary stream 32. The charge electrode 40 allows for an electrostatic charge to be selectively applied to any of the droplets 37,35 on a droplet-by-droplet basis. The charge electrode 40 is coupled to the controller 26 by electrical connection 42. Because of the highly predictable nature of droplet formation from capillary stream break-up, the time at which droplets 37,35 break from the capillary stream 32 is known to a precise degree, given the function at which the piezoelectric crystal 20 is driven and other system parameters. More particularly, the perturbation on the stream's radius grows exponentially in time, t, as $r(t) = r_o \pm r_o \kappa e^{\beta t}$, where k and β are the amplitude of the initial perturbation and the disturbance growth rate, respectively. The time at which droplets break from the capillary stream is the time when r(t)=0, i.e., when t=(1/β) ln(1/κ). See M. Orme, "On the Genesis of Droplet Stream Microspeed Dispersions," *Physics of Fluids,* 3, (12) pp 2936–2947, 1991.

Figure 4:
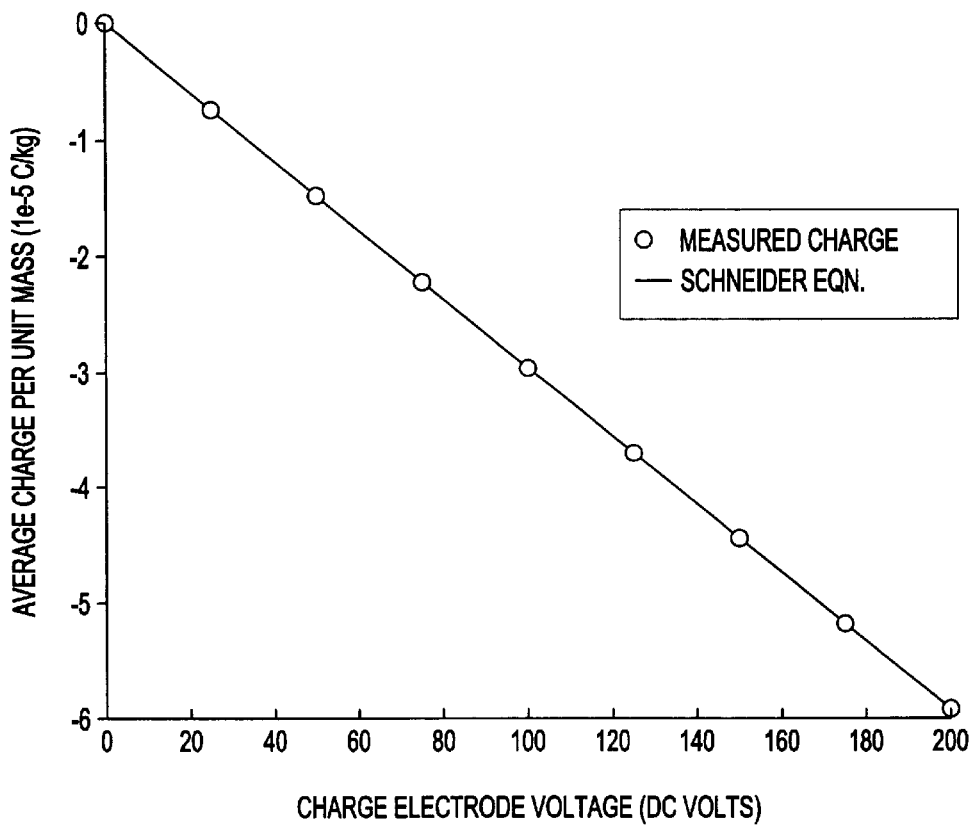
FIG. 4 is a graph of measured and theoretical droplet charge per mass versus charge electrode voltage.

It can be appreciated that an electrostatic charge on the charge electrode 40 causes a corresponding electrostatic charge on the conductive capillary stream 32. When a droplet 37,35 breaks from the stream 32, the droplet 37,35 is effectively short circuited; therefore, the droplet 37,35 will maintain that electrostatic charge while in flight. Each droplet 37,35 can thus be selectively charged, determined by the controller 26, by charging the charge electrode 40 to a predetermined value at the time that each droplet 37,35 breaks from the stream 32. The electrostatic charge, Q, per mass, m, of each droplet is given theoretically by Schneider's Equation:

$$\frac{Q}{m} = \frac{2\pi\varepsilon_0 V_c}{\rho r_o^2 \ln(b/r_o)}, \quad (3.0)$$

where $\varepsilon_o$ is the permitivity of free space, $V_c$ is the charge potential, ρ is the fluid density and b is the electrode radius. See J. M. Schneider, N. R. Lindblad, & C.D. Hendricks, "Stability of an Electrified Liquid Jet," *J. Applied Physics.* 38,6,2599, 1967. The graph of FIG. 4 compares measured and predicted results for the charge per unit mass of the droplets, using the apparatus and method described herein. As FIG. 4 shows, Schneider's Equation is useful to predict the charge of the droplets.

After being electrostatically charged, the droplets 37,35 of molten metal are directed to pass between a pair of deflection plates 44. The bias voltage across the deflection plates 44 is controlled by the controller 26. When a bias voltage is applied across the deflection plates 44 by electrical connections 46, it can be appreciated that an electric field is formed between the plates 44. As charged droplets 37,35 pass between the plates 44, and thus through this electric field, the droplets 37,35 are acted upon by an electrostatic force. The electrostatic force on a droplet is proportional to the electric field and to the charge of the droplet.

The magnitude of the electrostatic force acting on the droplet 37,35 determines the degree to which the droplet 37,35 is deflected—from an axis defined by the capillary stream 32—and thus the path the droplet 37,35 travels. The deflection ($x_d$) of a charged droplet due to the electrostatic field of a pair of deflection plates can be approximated by Fillmore's Approximation:

$$x_d = \frac{QE}{mv_0^2} l_{dp}\left(z_p - \frac{l_{dp}}{2}\right), \quad (4.0)$$

where $l_{dp}$ is the length of the deflection plates, Q is the charge, E is the electric field strength, m is the mass, $v_o$ is the droplet speed and $z_p$ is the vertical distance between the deflection plate and the target. See G. L. Fillmore, W. L. Buehner, & D. L. West, "Drop Charging and Deflection in an Electrostatic Ink Jet Printer," *IBM J. Res. Dev.* January 1977. A more accurate model that considers the effects of drag is given by the equations:

$$m\frac{dv_x}{dt} = QE - D\sin\theta \quad (5.0)$$

-continued $$m\frac{dv_z}{dt} = mg - D\cos\theta \qquad (5.1)$$

$$D = C_d \cdot \frac{1}{2}\rho_a v^2 \cdot A \qquad (5.2)$$

$$C_d = \frac{24}{\text{Re}} + \frac{6}{1+\sqrt{\text{Re}}} + 0.4 \qquad (5.3)$$

where D is the aerodynamic drag force, g is the gravitational constant, $\theta$ is the deflection angle measured from the undeflected stream, A is the frontal surface area of the sphere, $C_d$ is the dimensionless drag coefficient, and Re is the dimensionless Reynolds number. See Q. Liu, C. Huang, and M. Orme, "Mutual Electrostatic Charge Interactions Between Closely Spaced Charged Solder Droplets." *J. of Atomization and Sprays,* Vol. 10 no. 6, pp 565–585, 2000.

Figure 5:
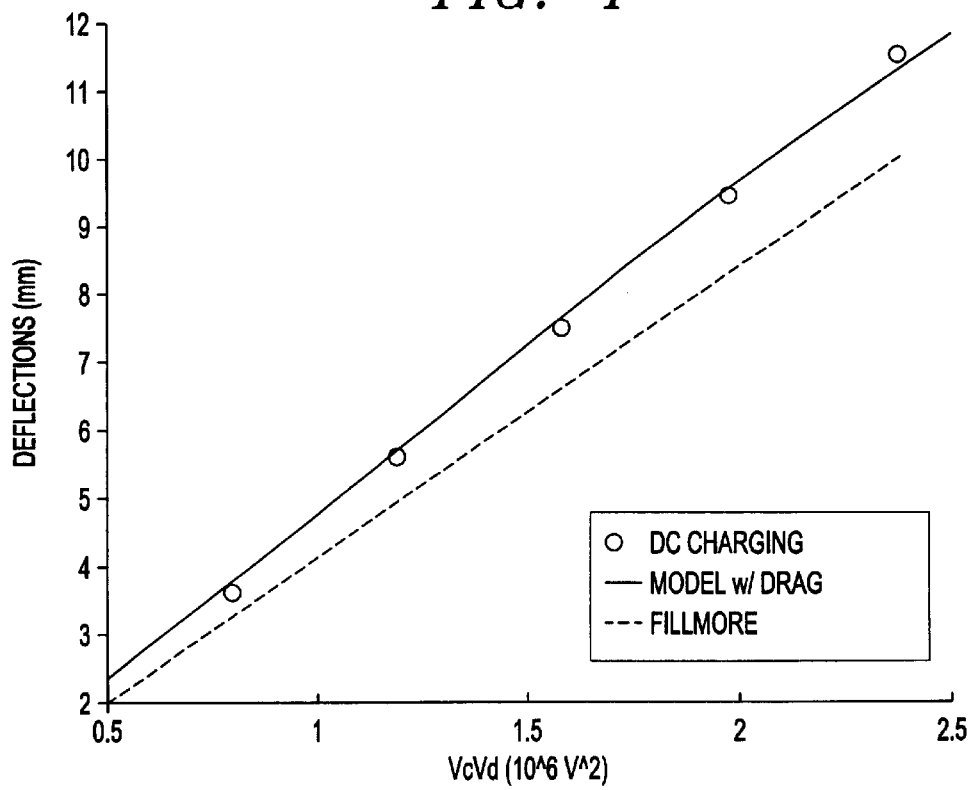
FIG. 5 is a graph of measured and theoretical droplet deflection given deflection plate biasing.

As FIG. 5 shows, this model (Equations 5.0–5.3), which incorporates drag, very accurately predicts measured deflection values. Fillmore's Approximation (Equation 4.0) also tends to indicate a droplet's deflection, although it tends to underestimate the actual deflection somewhat.

For the embodiment shown in FIG. 3, the satellite droplets 35 will have higher charge to mass ratios than the parent droplets 37, so the electrostatic deflection of the satellite droplets 35 will be greater. Accordingly, a collector 48 is provided to catch at least the satellite droplets 35, preferably after they have solidified to avoid defects. In one aspect of a preferred embodiment, the collector has a first section 50 and a second section 52, wherein the first and second sections 50,52 are aligned to catch the satellite and parent droplets 35,37, respectively.

Figure 6A:
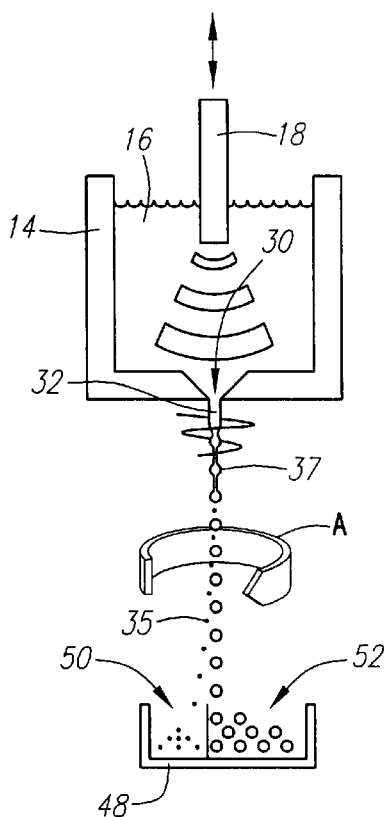
FIGS. 6a and 6b are is a schematic views of another embodiment for generating satellite droplets.
Figure 6B:
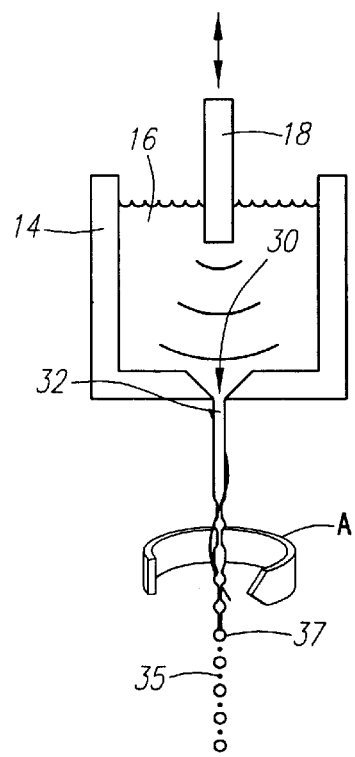

Another method of separating the satellite droplets from the parent droplets is by acoustic forcing. As shown in FIGS. 6a and 6b, acoustic forcing is used to exploit the rotation imparted onto the capillary stream 32 as it exists from the orifice 30. The direction of rotation is shown by arrow A. Due to conservation of angular momentum, increasing the amplitude of the excitation disturbance (as shown in FIG. 6a) causes the satellite droplets 35 to be deflected out of the main stream and away from the parent droplets 37. When the excitation amplitude is reduced (as shown in FIG. 6a), the effects of the rotation are less pronounced, and the satellite droplets do not separate from the main stream. As with the embodiment shown in FIG. 3, a collector 48 is provided to catch at least the satellite droplets 35, preferably after they have solidified to avoid defects. The collector preferably has a first section 50 and a second section 52, wherein the first and second sections 50,52 are aligned to catch the satellite and parent droplets 35,34, respectively.

Figure 7:
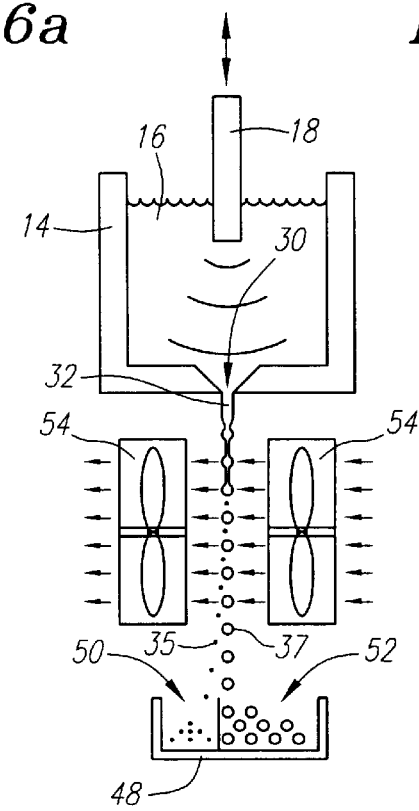
FIG. 7 is a schematic view of another embodiment for generating satellite droplets.

Another method of separating the satellite droplets from the parent droplets uses aerodynamic forces, as shown in FIG. 7. A transverse aerodynamic force is a applied to the satellite droplets 35 and parent droplets 37 by, e.g., fans 54, air jets or the like. Because of the mass difference between the satellite and parent droplets, the transverse aerodynamic force is large enough to propel the satellite droplets 35 out of the main stream, but it is insufficient to significantly affect the larger parent droplets 37. A collector 48 is provided to catch at least the satellite droplets 35, preferably after they have solidified to avoid defects.

With respect to any of the embodiments described, the parent droplets can be recycled back into the chamber 14 after they are collected. To avoid impurities, the recycled metal is preferably filtered.

To produce highly uniform and substantially spherical metal balls with little or no defects, it is important that the droplets solidify in flight. Cooling the spheres in flight avoids the problem of bonding between the molten droplets, either in flight or during their collection. Further, solidifying the droplets before they are collected avoids defects of their spherical shape that would result from a molten, or partially molten, droplet hitting a hard surface. Therefore, the balls formed in accordance with the present invention are preferably solidified before being collected. More effective cooling of the droplets can be accomplished in various ways. For example, lengthening the flight path gives the droplets more time to solidify. To further facilitate the cooling of the droplets in flight, the droplets may be actively cooled by directing them through a chamber filled with cryogenic (or otherwise cooled) inert gas.

Additionally, to more effectively cool the molten droplets in flight, the droplets may be directed in paths that are different from the path of their adjacent downstream droplet. This ensures that the air through which a droplet passes has not been heated by the preceding droplet in the series and that each droplet is expelled from the protective aerodynamic wake of its neighboring or preceding downstream drop, thereby allowing each droplet to cool more effectively. When discussing droplets in a series of droplets, downstream droplets are understood to be droplets that are produced earlier in the series, whereas upstream droplets are produced later. A droplet thus follows downstream droplets and is followed by upstream droplets (the "stream" in this case referring to the downward flow of metal). An adjacent droplet is a droplet in a series of droplets that is immediately upstream or downstream in the series. For these definitional purposes, because the satellite and parent droplets are being separated, a droplet's adjacent downstream droplet in either the satellite or parent stream is the droplet produced two cycles of the excitation frequency earlier, not the droplet produced immediately before it.

As described above, the droplets 37,35 can be selectively charged by the charge electrode 40. In this example, the droplets 37, 35 are charged with an amplitude varying waveform. The waveform by which the charge electrode 40—and thereby the droplets 37, 35—are charged is produced by, e.g., a waveform generator in the controller 26, and it should be understood that any waveform that varies the charge on the droplets 37,35 could be used (e.g., sawtooth, sinusoid, or the like). The charged droplets 37,35 are then directed through an electrostatic field (i.e., between a pair of deflection plates), where the droplets 37,35 are acted upon by an electrostatic force.

In the case of the embodiment of FIG. 3, the charge applied to the capillary stream and maintained by the droplets 37,35 is constant. As a result, the pair of deflection plates 44 functions to separate the satellite droplets 35 from the parent droplets 37. If the charge applied to the charge electrode 40—and thereby the droplets 37,35—is varied over time, the pair of deflection plates 44 functions to vary the deflection or path of adjacent satellite droplets 35 and parent droplets 37 in their respective streams, in addition to separate the satellite droplets 35 from the parent droplets 37. Alternatively, a second pair of deflection plates orthogonally oriented to the first pair of deflection plates 44 could be used to further disperse the droplets 37,35 on a second axis orthogonal to the first. In another alternative embodiment, the deflection plates 44, in the case of a single pair of deflection plates, may rotate to radially deflect the droplets. In the case of two pairs of deflection plates, preferably the second pair may rotate to radially deflect the droplets.

Other alternatives may include applying electrostatic charges to the droplets 37,35 that are constant while driving the deflection plates with a varying bias voltage to vary the deflection of the droplets 37,35. In the case of two pairs of deflection plates, another alternative would be to drive the first pair of deflection plates with a constant bias voltage to separate the satellite droplets 35 from the parent droplets 37, while the second pair of deflection plates is driven at a varying bias voltage to vary the deflection of the droplets 37,35.

A significant advantage of the present invention is that it enables the production of micro-metallic spheres that are significantly smaller than the diameter of the orifice from which they emerge, i.e., ball diameters preferably in a range of about 1.0 to 100 microns and preferably less than about 25 microns. Because much smaller spheres can be produced with larger diameter orifices, the difficulties plaguing smaller orifices, such as orifice clogging, tend to be avoided with the present invention. Additionally, an advantage of the present invention is that the micro-metallic balls, i.e., satellite or satellite and parent combined, can be produced at very high rates several orders of magnitude greater than conventional methods, i.e., preferably on the order of tens of thousands of balls per second, while still maintaining a high degree of uniformity without having to perform an additional step of mechanically sieving or sorting. More particularly, the micro-metallic balls may be produced in accordance with the present invention at a rate preferably in a range of about 1000 to 200,000 balls per second and preferably at a rate greater that 4000 balls per second, while the ball diameter may be maintained within a tolerance of a mean ball diameter preferably in the range of about 0.5 to 3.0 percent and preferably less than 2.0 percent.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method of manufacturing ultra-small metallic spheres comprising the steps of:
    forming parent and satellite droplets from a capillary stream of molten metal;
    separating the satellite droplets from the parent droplets;
    cooling the satellite droplets to solidify the balls; and
    collecting the satellite balls.

2. The method of claim 1, wherein the forming step comprises the steps of directing a capillary stream of molten metal from an orifice by applying an excitation disturbance, wherein the excitation disturbance is determined so that parent droplets and satellite droplets form from the stream due to capillary stream break-up;

3. The method of claim 1, wherein the separating step comprises the steps of:
    imparting an electrostatic charge to the satellite and parent droplets; and
    deflecting the satellite and parent droplets by directing the droplets through an electric field.

4. The method of claim 3, wherein the deflecting step includes the steps of varying the electric field.

5. The method of claim 3, wherein the deflecting step includes the steps of applying a constant electric field and varying the electric charge on the droplets.

6. The method of claim 3, wherein at least a portion of the electric field is created by applying a voltage across a pair of deflection plates, the satellite and parent droplets being directed through the pair of deflection plates.

7. The method of claim 1, wherein the separating step comprises increasing the magnitude of the excitation disturbance to thereby increase rotation of the capillary stream as it exists the orifice, wherein the satellite droplets are deflected from the parent droplets.

8. The method of claim 1, wherein the separating step comprises applying an aerodynamic force to the satellite and parent droplets, the aerodynamic force having at least a component in a direction orthogonal to the capillary stream.

9. The method of claim 2, wherein the excitation disturbance comprises harmonic disturbances.

10. The method of claim 1, wherein the collected satellite balls have a diameter in a range of about 1 to 100 microns.

11. The method of claim 10, wherein the collected satellite balls have a diameter of less than 25 microns.

12. The method of claim 1, wherein each diameter of the satellite balls is within a range of about 0.5 to 3.0% of a mean ball diameter.

13. The method of claim 1, further comprising the step of recycling the parent droplets back into the molten metal.

14. The method of claim 13, further comprising the step of filtering the molten metal.

15. The method of claim 1, wherein the cooling step comprises actively cooling at least the satellite droplets in flight by directing the satellite droplets through a chamber filled with a cooled gas.

* * * * *